United States Patent [19]
Pellegrini et al.

[11] Patent Number: 5,510,947
[45] Date of Patent: Apr. 23, 1996

[54] ELECTROSTATIC DISCHARGE PROTECTIVE DEVICE HAVING A REDUCED CURRENT LEAKAGE

[75] Inventors: Franco Pellegrini, Corsico; Marco Morelli, Livorno; Athos Canclini, Como, all of Italy

[73] Assignee: SGS-Thomson Microelectronics S.r.l., Agrate Brianza, Italy

[21] Appl. No.: 367,747

[22] Filed: Jan. 3, 1995

Related U.S. Application Data

[63] Continuation of Ser. No. 941,393, Sep. 8, 1992, abandoned.

[30] Foreign Application Priority Data

Sep. 19, 1991 [IT] Italy .................................. VA91A0030

[51] Int. Cl.⁶ ...................................................... H02H 9/04
[52] U.S. Cl. ............................... 361/56; 361/111; 361/91; 257/355
[58] Field of Search ............................. 361/56, 111, 91, 361/212, 220; 257/355, 357, 358, 360, 603, 556, 557, 547

[56] References Cited

U.S. PATENT DOCUMENTS

| | | | |
|---|---|---|---|
| 4,158,863 | 6/1979 | Naylor | 361/56 |
| 4,302,792 | 11/1981 | Harwood | 361/92 |
| 4,922,371 | 5/1990 | Gray et al. | 361/91 |

FOREIGN PATENT DOCUMENTS

| | | |
|---|---|---|
| 2590726 | 5/1987 | France. |
| 2176053 | 5/1986 | United Kingdom. |
| 2182490 | 10/1986 | United Kingdom. |

Primary Examiner—A. D. Pellinen
Assistant Examiner—Sally C. Medley
Attorney, Agent, or Firm—David M. Driscoll; James H. Morris; Brett N. Dorny

[57] ABSTRACT

In an anti-ESD protective structure, especially designed for pins destined to reach below ground and/or above supply voltages, includes a pair of Zener diodes or lateral NPN structures with a resistive connection between base and emitter, connected in opposition among each other between the pin to be protected and a grounded substrate of the integrated circuit. An amplifying effect on the leakage current which is drawn/injected through the pin by the protective structure caused by the triggering of an intrinsic parasitic transistor is effectively eliminated by connecting a biasing element, such as a forward biased junction, between the node of interconnection between the two Zener orlateral NPN structures and a node of the integrated circuit biased with a voltage sufficiently high as to ensure, under any condition, a reverse biasing of the base-emitter junction of the parasitic transistor.

27 Claims, 3 Drawing Sheets

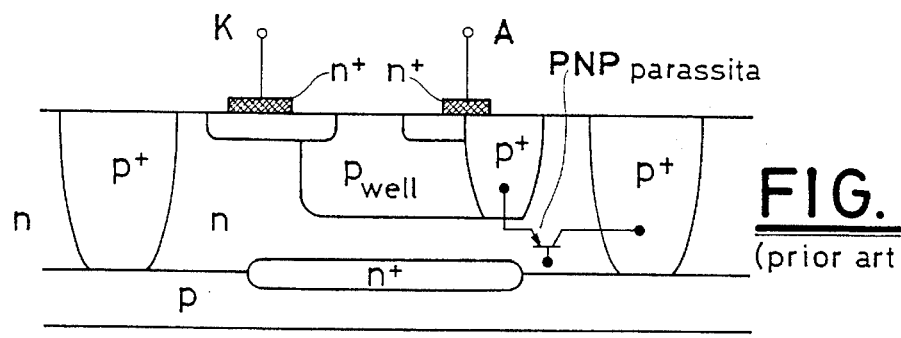
FIG. 1 (prior art)
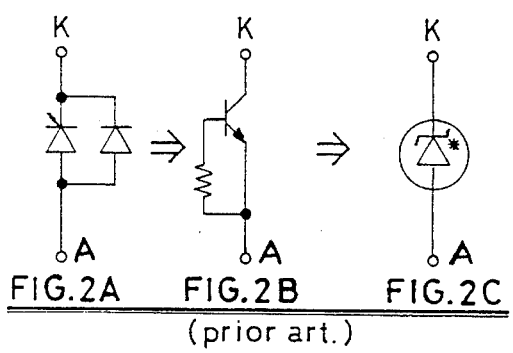
FIG. 2A  FIG. 2B  FIG. 2C
(prior art.)
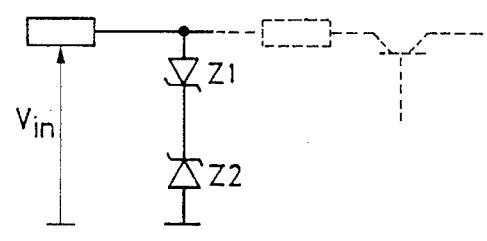
FIG. 3 (prior art)
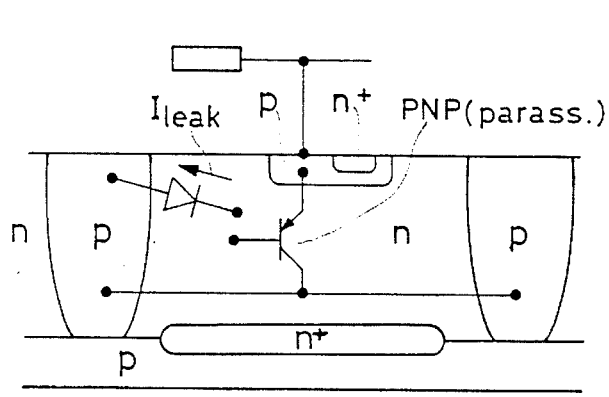
FIG. 4 (prior art.)
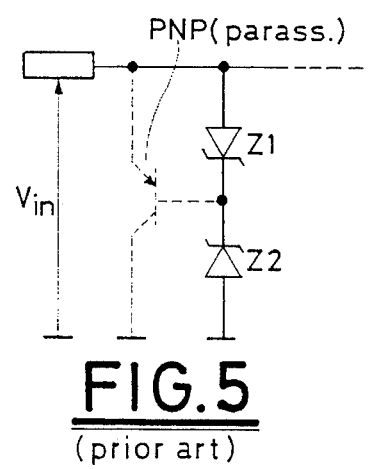
FIG. 5 (prior art)

ELECTROSTATIC DISCHARGE PROTECTIVE DEVICE HAVING A REDUCED CURRENT LEAKAGE

This application is a continuation of application Ser. No. 07/941,393, filed Sep. 8, 1992, now abandoned.

BACKGROUND OF THE INVENTION

Integrated circuits are often provided with protective integrated structures against electrical discharges of electrostatic origin which may hit an external pin of the integrated circuit.

The basic principle of operation of an electrostatic discharge (ESD) protective device consists in limiting to an established maximum tolerable value, dictated by the particular fabrication process, voltage spikes which may occur on the pins of the integrated circuit, in order to prevent breakdown of integrated structures which are connected to the respective pins, and which because of their intrinsic characteristics are often unable to tolerate voltage spikes greater than a certain amplitude. The amplitude of voltage spikes of an electrostatic origin may easily reach several KV with a maximum energy associated therewith on the order of several mjoule, e.g. according to the so-called "Human Body Model". In view of the fact that the rise time of these spikes is typically a few nanoseconds (ns), the reaction time of the protection structure must be extremely fast. Commonly the integrated structures used for implementing an ESD protection are constituted by Zener diodes, SCR, and lateral NPN structures with a resistive connection between base and emitter. A prior art integrated structure of this latter type, as depicted in FIG. 1, has the configuration of a lateral NPN transistor wherein its base region is connected to its emitter region through a resistive path. The structure may be considered a diode constituted by the base/collector junction, which exhibits a voltage/current characteristic having a well defined zone showing a negative slope in the first quadrant.

Other equivalent electrical schemes of the prior art integrated structure of FIG. 1 are shown in FIGS. 2A and 2B for simplicity's sake or the prior art integrated structure of FIG. 1 may be symbolically indicated by means of a diode symbol inscribed in a circle together with an asterisk, as depicted in FIG. 2C.

Commonly in literature, this prior art discharge structure is referred to simply as "lateral NPN", with the understanding that the NPN structure includes a resistive connection between the base and emitter regions, when configured for use as an ESD protection device.

In addition, some pins of integrated circuits (e.g. an input pin) must be capable of operating with negative voltages with respect to ground (i.e., below ground), and/or with voltages higher than the supply voltage, as it is well known to a person skilled in the art. An ESD protection device may be implemented also for these pins; a prior art such device is symbolically shown in FIG. 3. In such prior art devices, the ESD protection device is implemented by utilizing two Zener diodes, Z1 and Z2, or two lateral NPNs with a resistive connection between base and emitter, connected in series and in opposition with each other between the (input) pin to be protected and a substrate of the integrated circuit connected to ground.

This type of prior art integrated protection structure has several drawbacks tied to the triggering of an intrinsic parasitic transistor which makes the structure unusable in integrated circuits wherein a very small current absorption of the ESD protection structure must be ensured; for example, in the case of an input pin of an operational amplifier. FIGS. 4 and 5 show schematically a prior art integrated protection structure realized in an integrated circuit having typical junction-isolation architecture and comprising a p-type semiconducting substrate and an n-type epitaxial layer, wherein the various devices are formed within regions of the n- type epitaxial layer laterally defined by p+ isolation diffusions. Both in FIG. 4 and in FIG. 5, a PNP parasitic transistor (PNPparas.), is intrinsic to the integrated protection structure Z2.

In this case, the base current of the parasitic transistor is constituted by the leakage current (Ileak) of the diffusions which realize the two Zener diodes, Z1 and Z2, beside the intrinsic leakage current of the Z2 diode and the total current drawn by the ESD protection structure through the protected pin. This total current is given by the following relation:

$$I_{tot} = I_{leaktot} \times G$$

where G is the current gain of the parasitic transistor, which is intrinsic to the integrated ESD protection structure.

As a consequence the current which is drawn (or injected) through the relative pin of the integrated circuit, the current represents an intrinsic leakage current amplified by the parasitic transistor and, therefore, may reach untolerable levels for many applications. A parasitic PNP transistor is also present also within the integrated structure of a lateral NPN and is provided with a resistive connection between base and emitter, which is usable in place of a Zener structure as a discharge element, as symbolically shown in FIG. 1.

SUMMARY OF THE INVENTION

Accordingly a general object of the present invention is to provide a circuit arrangement which may be easily realized, and which practically nullifies the amplifying effect of an intrinsic parasitic transistor on the intrinsic leakage current of a particular ESD protection structure.

Another object of the present invention is to provide a protective structure usable with specific types of pins of an integrated circuit when a low current leakage must be ensured.

These objects and other advantages of the present invention are achieved by employing a biasing element, connected between a connection node between two discharge elements of the ESD protection structures (such as two Zener diodes in opposition with each other or between two lateral NPN structures with a resistive connection between base and emitter, and which coincides with a base region of an intrinsic parasitic transistor), and a circuit node which is maintained at a certain voltage Vx having a value which satisfies the following condition:

$$Vx - Vfd > Vin(+)_{max} \tag{1}$$

where Vfd represents a voltage drop through said biasing element and Vin(+)max represents the maximum design voltage (positive with respect to ground) which the protected pin will reach during a normal operation of the circuit, in order to reverse bias the base-emitter junction of the parasitic transistor, thus nullifying its amplifying effect upon the total leakage current of the integrated anti ESD protection structure. The biasing element may be constituted by a forward biased diode or a functionally equivalent structure such as, for example, a Zener junction or a lateral NPN structure with a resistive connection between base and emitter.

BRIEF DESCRIPTION OF THE DRAWINGS

As described above, FIGS. 1, 2A, 2B and 2C, show a prior art integrated discharge structures used for implementing ESD protection, consisting of a lateral NPN transistor with a resistive connection between base and emitter. FIGS. 3, 4 and 5 schematically depict prior art ESD protection structures for a pin of an integrated circuit.

DETAILED DESCRIPTION

Figure 6:
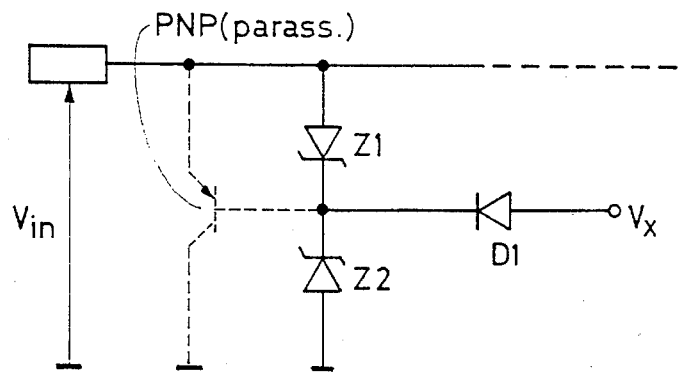
FIG. 6 shows an embodiment of the improved integrated ESD protective structure of the present invention.

With reference to the circuit shown in FIG. 6, an anti ESD protective integrated device of the invention comprises a forward biased diode D1, functionally connected to a node at Vx potential, and capable of inversely biasing the base-emitter junction of a parasitic PNP transistor (PNPparas.) (symbolically depicted by means of phantom lines) of the integrated protective structure. The structure includes two Zener Z1 and Z2, used, in conjunction with diode $D_1$, to nullify the amplifying effect on the leakage current by the intrinsic parasitic PNP transistor. Such a nullifying effect is achieved by connecting the biasing diode D1 to a voltage Vx having a level which will satisfy the above-indicated condition (1).

Figure 9A:
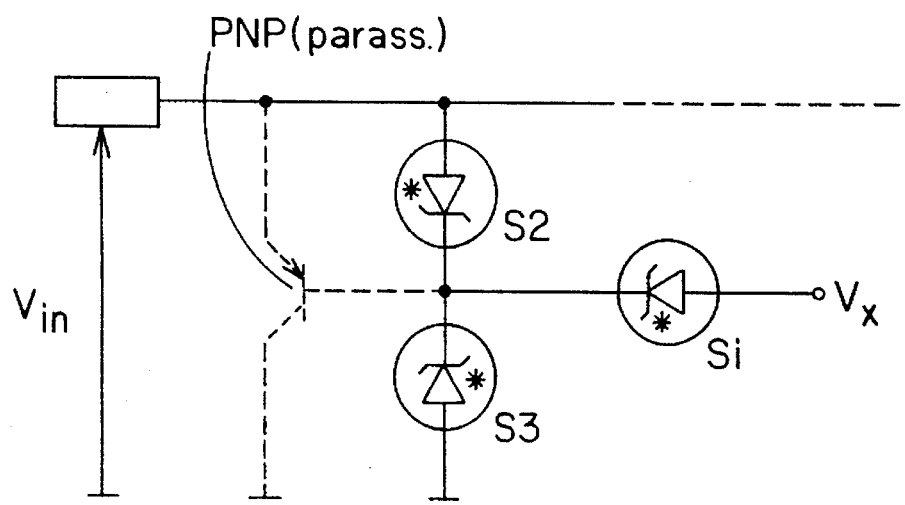
FIGS. 9A and 9B show other embodiments of the improved integrated ESD protective structure of the present invention.
Figure 9B:
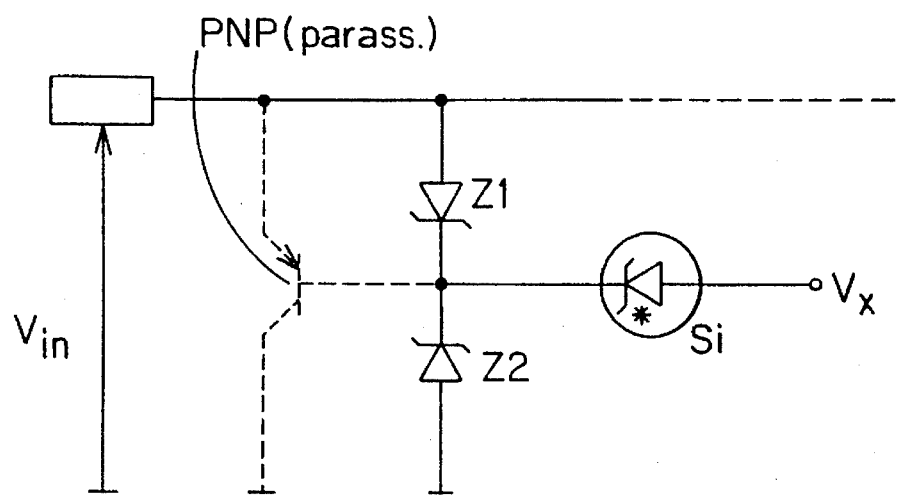

Of course, the Zener diodes Z1, Z2 and the biasing diode D1 can be replaced by lateral NPN structures with a resistive connection between base and emitter. Such structures are illustrated in FIGS. 9A and 9B.

In the specific embodiment depicted in FIG. 4 as it relates to an input pin of a functional circuit, because under normal operation conditions of the integrated circuit the Zener diode Z1 must be prevented from going into breakdown when the applied voltage on the input pin Vin drops to the maximum negative design value with respect to ground, the Vx voltage may advantageously have a value which also satisfies the following condition:

$$Vbz1 > Vin(-) + (Vx - Vfd)$$

where Vbz1 is the voltage drop across the Zener Z1. These considerations remain valid also when in place of the Zener diodes, lateral NPN structures with a resistive connection between base and emitter are used.

The current which is eventually absorbed/injected through the protected pin by the ESD protection structure of the invention will remain purely an intrinsic leakage current without being subject to any amplifying effect because of the triggering of an intrinsic parasitic transistor.

Figure 7:
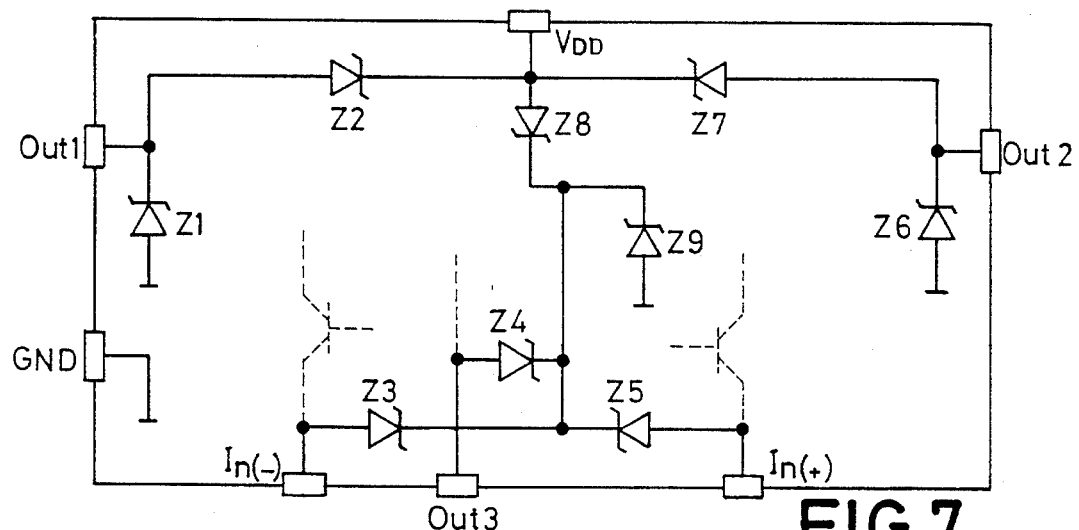
FIG. 7 is a partial illustration of an integrated circuit, e.g. an operational amplifier, provided with a protective device of the invention, specifically applied to two input pins of the integrated circuit.

The anti ESD protection structures as may be applied to the pins of an integrated operational amplifier are schematically shown in FIG. 7. In the application shown, the pins protected by means of the improved structure of the present invention are the two input pins: In(−) and In(+). In the embodiment of FIG. 7, the biasing element is the Zener diode Z8 which performs the same function of the diode D1 of the circuit depicted in FIG. 6. The voltage node VDD to which the biasing diode Z8 is connected, coincides, in the embodiment of FIG. 7, with the node Vx of FIG. 6. This arrangement is possible whenever the contemplated maximum design voltage for the two input pins is lower than VDD_Vfd.

As should be evident to one skilled in the art, the particular configuration of the ESD protective structure will protect all the pins from positive and negative discharges as well as from discharges among different pins, as contemplated by widely applied standard specifications.

Figure 8:
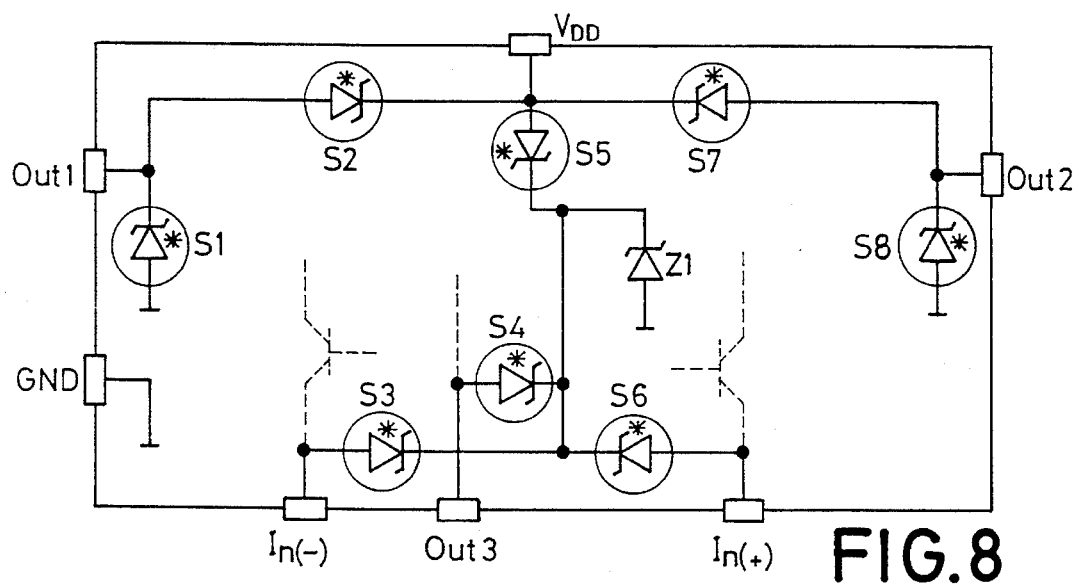
FIG. 8 is a partial illustration of an integrated circuit similar to the one depicted in FIG. 7, wherein the anti ESD protective device of the invention is realized by employing lateral NPN transistors with a resistive connection between base and emitter in place of Zener diodes.

Of course the Zener diodes of the protection structure of FIG. 7 may be replaced by lateral NPN structures with a resistive connection between base and emitter, as symbolically shown in FIG. 8. Only the supply pin (VDD) remains protected by means of a Zener diode Z1. In this embodiment the biasing function performed by the diode D1 of FIG. 6 is performed by the lateral NPN S5.

It is to be appreciated that the foregoing description is presented by way of example only and in no way is intended to be limiting. The scope of protection is defined by the appended claims and equivalents thereto.

What is claimed is:

1. An integrated structure for protecting integrated components connected to a pin of an integrated circuit which may be hit by an electrostatic discharge, the structure comprising:

a pair of discharging elements connected in series between the pin and ground, with the discharging elements opposing one another; and a biasing element connected between a node of interconnection between the discharging elements and a supply voltage node to provide a voltage at the node of interconnection greater than a maximum design voltage reached by the pin under normal conditions, said biasing element biasing said node of interconnection such that leakage current is limited during normal operation of the integrated circuit.

2. An integrated structured as recited in claim 1 wherein each discharging element includes a Zener diode.

3. An integrated structure as recited in claim 2 wherein said biasing element includes a Zener diode.

4. An integrated structure as recited in claim 2 wherein said biasing element includes a lateral NPN structure having a resistive connection between a base region and an emitter region thereof.

5. An integrated structure as recited in claim 2 wherein the supply voltage (Vx) satisfies the following condition:

$$Vbz1 > Vin(-) + (Vx - Vfd)$$

wherein Vbz1 is the voltage drop across a first Zener diode, Vin(−) is a maximum negative design voltage with respect to ground which the voltage on the pin may reach under normal operating conditions, and Vfd is a voltage drop across the biasing element.

6. An integrated structure as recited in claim 1 wherein each discharging element includes a lateral NPN structure having a resistive connection between a base region and emitter region thereof.

7. An integrated structure as recited in claim 6 wherein said biasing element includes a Zener diode.

8. An integrated structure as recited in claim 6 wherein said biasing element includes a lateral NPN structure having a resistive connection between a base region and an emitter region thereof.

9. An integrated structure as recited in claim 6 wherein the supply voltage (Vx) satisfies the following condition:

$$Vbz1 > Vin(-) + (Vx - Vfd)$$

wherein Vbz1 is the voltage drop across a first lateral NPN structure, Vin(−) is a maximum negative design voltage with respect to ground which the voltage on the pin may reach under normal operating conditions, and Vfd is a voltage drop across the biasing element.

10. An integrated structure as recited in claim 1 wherein said biasing element includes a diode.

11. An integrated structure as recited in claim 1 wherein said biasing element includes a Zener diode.

12. An integrated structure as recited in claim 1 wherein said biasing element includes a lateral NPN structure having a resistive connection between a base region and an emitter region thereof.

13. An integrated structure for protecting integrated components connected to a pin of an integrated circuit which may be hit by an electrostatic discharge, the structure comprising:
   a pair of means for discharging connected in series between the pin and ground, with the discharging means opposing one another; and
   means for biasing connected between a node of interconnection between the discharging means and a supply voltage node to provide a voltage at the node greater than a maximum design voltage reached by the pin under normal conditions, said biasing means biasing said node of interconnection such that leakage current is limited during normal operation of the integrated circuit.

14. An integrated structure as recited in claim 13 wherein each of said discharging means includes a Zener diode.

15. An integrated structure as recited in claim 14 wherein the biasing means includes a lateral NPN structure having a resistive connection between a base region and an emitter region thereof.

16. An integrated structure as recited in claim 13 wherein each discharging means includes a lateral NPN structure having a resistive connection between a base region and an emitter region thereof.

17. An integrated structure as recited in claim 15 wherein the biasing means includes a Zener diode.

18. An integrated structure as recited in claim 16 wherein the biasing means includes a lateral NPN structure having a resistive connection between a base region and an emitter region thereof.

19. An integrated structure as recited in claim 13 wherein the biasing means includes a lateral NPN structure having a resistive connection between a base region and an emitter region thereof.

20. An integrated structure as recited in claim 14 wherein the biasing means includes a Zener diode.

21. An integrated structure as recited in claim 13 wherein the biasing means includes a diode.

22. An integrated structure as recited in claim 13 wherein the biasing means includes a Zener diode.

23. A protective network for protection of integrated components connected to pins of integrated circuits which may be hit by electrostatic discharges, the network comprising:
   a discharge zener diode connected between ground and an intermediate node of the network to which intermediate node a cathode of a protection diode of the network is connected, the anode of the protection diode being connected to a pin to be protected; and
   a biasing element connected between the intermediate node and a supply rail of the integrated circuit, to provide a voltage at the intermediate node greater than a maximum design voltage reached by the pin under normal operating conditions the biasing element including a forward biased junction, said biasing element biasing said intermediate node such that leakage current is limited during normal operation of the integrated circuit.

24. An integrated structure as recited in claim 23 wherein cathodes of a plurality of protection diodes of the network are connected to the intermediate node, each of the diodes having an anode connected to a pin of the integrated circuit to be protected.

25. A protective network for protection of integrated components connected to pins of integrated circuits which may be hit by electrostatic discharges, the network comprising:
   means for discharging connected between ground and an intermediate node of the network to which intermediate node a cathode of a protection diode of the network is connected, the anode of the protection diode being connected to a pin to be protected; and
   means for biasing connected between the intermediate node and a supply rail of the integrated circuit, the biasing means including means for providing a voltage at the intermediate node greater than a maximum design voltage reached by the pin under normal conditions, said biasing means biasing said intermediate node such that leakage current is limited during normal operation of the integrated circuit.

26. An integrated structure as recited in claim 25 wherein cathodes of a plurality of protection diodes of the network are connected to the intermediate node, each of the diodes having an anode connected to a pin of the integrated circuit to be protected.

27. An electrostatic protective device for protecting an input pin of an integrated circuit against an over voltage condition caused by an electrostatic discharge, the device including a pair of discharging elements connected in series between the pin and a voltage reference point, the pair of discharging elements including a parasitic transistor having a collector coupled to the pin, an emitter coupled to the voltage reference point, and a base coupled to an intermediate node of the pair of discharging elements, the improvement comprising a biasing element coupled between the intermediate node and a voltage supply rail, and wherein the biasing element provides a voltage at the intermediate node greater than a maximum design voltage reached by the pin under normal conditions to bias the parasitic transistor to an off state to limit leakage current through the pair of discharging elements.

\* \* \* \* \*